United States Patent
Chrysler et al.

(10) Patent No.: US 7,557,438 B2
(45) Date of Patent: Jul. 7, 2009

(54) COOLING MECHANISM FOR STACKED DIE PACKAGE, AND METHOD OF MANUFACTURING STACKED DIE PACKAGE CONTAINING SAME

(75) Inventors: Gregory M. Chrysler, Chandler, AZ (US); Rajashree Baskaran, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 421 days.

(21) Appl. No.: 11/414,273

(22) Filed: Apr. 27, 2006

(65) Prior Publication Data
US 2007/0252253 A1 Nov. 1, 2007

(51) Int. Cl.
H01L 23/02 (2006.01)
H01L 23/34 (2006.01)
H01L 23/36 (2006.01)
H01L 23/373 (2006.01)
H01L 23/473 (2006.01)
H01L 25/065 (2006.01)

(52) U.S. Cl. .............................. 257/686; 257/E23.098; 257/E23.125; 257/E25.013; 257/E23.101; 257/E23.105; 257/E23.11; 257/706; 257/778; 257/678; 257/720

(58) Field of Classification Search ................ 257/686, 257/678, E23.098, E23.125, E23.013, E23.11, 257/E23.101, E23.105, 706, 778, 720; 438/106, 438/122
See application file for complete search history.

(56) References Cited

U.S. PATENT DOCUMENTS

| 5,769,155 | A | 6/1998 | Ohadi et al. |
| 6,515,383 | B1 | 2/2003 | Ognibene et al. |
| 6,888,721 | B1 | 5/2005 | Moghaddam et al. |
| 6,951,982 | B2 | 10/2005 | Chye |
| 7,015,572 | B2 | 3/2006 | Yamaji |
| 2004/0022026 | A1 | 5/2004 | Belady |
| 2004/0190251 | A1* | 9/2004 | Prasher et al. ............... 361/699 |
| 2005/0046017 | A1* | 3/2005 | Dangelo ..................... 257/720 |
| 2005/0141195 | A1* | 6/2005 | Pokharna et al. ............ 361/699 |
| 2007/0114656 | A1* | 5/2007 | Brandenburg et al. ....... 257/714 |
| 2007/0267740 | A1* | 11/2007 | Khan et al. .................. 257/712 |
| 2007/0278948 | A1* | 12/2007 | Sakata et al. ................ 313/506 |
| 2007/0289768 | A1* | 12/2007 | Moore et al. ................... 174/98 |

OTHER PUBLICATIONS

Adam Gruen, "The Heat is On", MDA Update, Issue #46 (Summer 2003), Missile Defense Agency Technology quarterly pub., pp. 1, 14, 15, and 16.

* cited by examiner

Primary Examiner—Alexander O Williams
(74) Attorney, Agent, or Firm—Kenneth A. Nelson; Intel Corporation

(57) ABSTRACT

A stacked die package includes a substrate (210, 310), a first die (220, 320) above the substrate, a spacer (230, 330) above the first die, a second die (240, 340) above the spacer, and a mold compound (250, 370) disposed around at least a portion of the first die, the spacer, and the second die. The spacer includes a heat transfer conduit (231, 331, 333, 351, 353) representing a path of lower overall thermal resistance than that offered by the mold compound itself. The heat transfer path created by the heat transfer conduit may result in better thermal performance, higher power dissipation rates, and/or lower operating temperatures for the stacked die package.

26 Claims, 3 Drawing Sheets

COOLING MECHANISM FOR STACKED DIE PACKAGE, AND METHOD OF MANUFACTURING STACKED DIE PACKAGE CONTAINING SAME

FIELD OF THE INVENTION

The disclosed embodiments relate generally to stacked die packages, and relate more particularly to cooling techniques for a stacked die package.

BACKGROUND OF THE INVENTION

When many dies are stacked vertically in a package the thermal path for the dissipation of the heat generated by the dies is limited. Stacked die packages are typically encapsulated in a material that does not dissipate heat well, and if the heat dissipation problem is not addressed, the dies may be overheated at operating conditions, leading to possible problems with transistor performance and reliability. Accordingly, there exists a need for a cooling architecture that is capable of achieving effective overall thermal performance of a stacked die package.

BRIEF DESCRIPTION OF THE DRAWINGS

The disclosed embodiments will be better understood from a reading of the following detailed description, taken in conjunction with the accompanying figures in the drawings in which.

Figure 1:
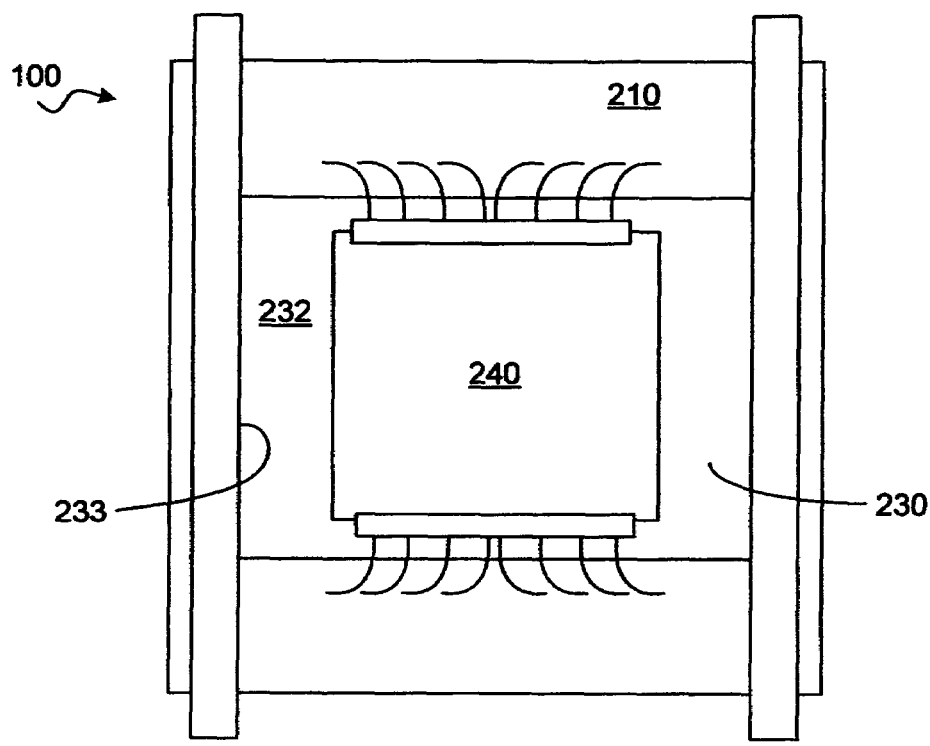
FIG. 1 is a top view of a stacked die package according to an embodiment of the invention.

For simplicity and clarity of illustration, the drawing figures illustrate the general manner of construction, and descriptions and details of well-known features and techniques may be omitted to avoid unnecessarily obscuring the disclosed embodiments of the invention. Additionally, elements in the drawing figures are not necessarily drawn to scale. For example, the dimensions of some of the elements in the figures may be exaggerated relative to other elements to help improve understanding of embodiments of invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a stacked die package comprises a substrate, a first die above the substrate, a spacer above the first die, a second die above the spacer, and a mold compound disposed around at least a portion of the first die, the spacer, and the second die. The spacer comprises a heat transfer conduit representing a path of lower overall thermal resistance than that offered by the mold compound itself. The heat transfer path created by the heat transfer conduit may result in better thermal performance, higher power dissipation rates, and/or lower operating temperatures for the stacked die package.

Figure 2:
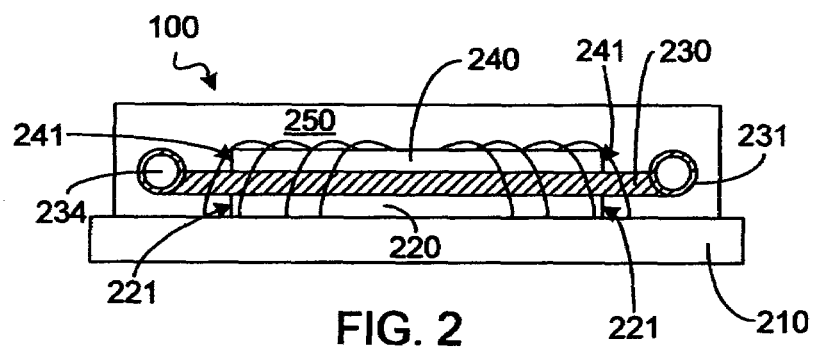
FIG. 2 is a cross-sectional view of the stacked die package of FIG. 1.

FIG. 1 is a top view and FIG. 2 is a cross-sectional view of a stacked die package 100 according to an embodiment of the invention. As illustrated in FIGS. 1 and 2, stacked die package 100 comprises a substrate 210, a die 220 above substrate 210, a spacer 230 above die 220, a die 240 above spacer 230, and a mold compound 250 disposed around at least a portion of die 220, spacer 230, and die 240. (In FIG. 1 mold compound 250 has been removed so as to more clearly show the other components of stacked die package 100.)

Spacer 230 comprises a heat transfer conduit 23 1. Heat transfer conduit 231 helps cool die 220 and die 240 by transferring heat generated by dies 220 and 240 away from dies 220 and 240 and toward a location where such heat may be safely dissipated or where such heat has a lesser effect on the performance of dies 220 and 240. Heat transfer conduit 231 may in one embodiment be similar to a heat pipe, a cooling tube, or the like such as have been used in other contexts for thermal management purposes. Although heat transfer conduit 231 as depicted in FIG. 2 has a circular cross section, such cross section is not a requirement, and heat transfer conduit 231 could have a cross section that is triangular, square, oval, rectangular, or a variety of other shapes. In one embodiment, heat transfer conduit 231 can be hollow, as illustrated in FIG. 2. In another embodiment heat transfer conduit 231 can be solid. In all of the foregoing embodiments, a portion of spacer 230 forms a conduit similar or substantially identical to heat transfer conduit 231.

In order to reach heat transfer conduit 231, at least some of the heat generated by dies 220 and 240 must travel across or through spacer 230. Accordingly, the overall thermal efficiency of stacked die package 100 is increased if spacer 230 is formed from a material with low thermal resistance. Such materials include copper, aluminum, silver, silicon, and silicon carbide, and spacer 230, in various embodiments, may be formed from any of such materials. Other materials, though perhaps less cost effective than those already mentioned, are also thermally conductive to an adequate or even optimal degree and may also be used in certain embodiments. Examples of this latter category of materials include diamond, which is very expensive but also highly thermally conductive, gold, which is expensive and not as thermally conductive as some of the other materials mentioned above but is very easy to work with, and composites of any of the materials mentioned in this paragraph. Composite materials are advantageous in that they are capable of being molded.

As mentioned above, heat transfer conduit 231 represents a heat transfer path having a thermal resistance lower than that of other paths through mold compound 250. The manner in which heat transfer conduit 231 is connected to the rest of spacer 230 has an effect on the efficiency of the heat transfer, which is to say it has an effect on the thermal resistance of the heat transfer path that is heat transfer conduit 231. In one embodiment, a portion of spacer 230 is rolled into a tube or roll at the perimeter of spacer 230, where the tube or roll is heat transfer conduit 231, such that heat transfer conduit 231 flows seamlessly into the rest of spacer 230. In another embodiment, heat transfer conduit 231 originates as or is previously formed into a tube, a roll, a solid rod, or the like as discussed above and is later attached to spacer 230. As an example, heat transfer conduit 231 in this latter embodiment can be soldered or brazed to spacer 230, can be bonded to spacer 230 with a thermally conductive epoxy or the like, or can be attached to spacer 230 in some other manner. Of the two embodiments described in this paragraph, the former is likely to be more efficient in terms of heat transfer because the heat does not have to pass through a materials junction like that represented by the solder or other joint in the latter embodiment.

In a particular embodiment heat transfer conduit 231 is not a rod, a tube, or anything of the kind but rather is a substantially flat sheet in the same plane as spacer 220. (In this particular embodiment the resulting cooling path may need to be longer and thus less efficient than that represented by a cooling path that is curved or rolled in the manner shown in FIG. 2 or in a similar manner.) In either embodiment, whether heat transfer conduit 231 is rolled or flat, a portion of spacer 230 extends beyond an edge of dies 220 and 240. In other words, as seen in cross section in FIG. 2, die 220 has an edge 221, die 240 has an edge 241, and heat transfer conduit 231 extends beyond edges 221 and 241. This is in contrast to a typical situation found in existing stacked die packages with spacers, in which the spacer has a smaller footprint than the dies above and below, and therefore nowhere extends beyond the edges of the dies.

In one embodiment, heat transfer conduit 231 is at least partially exposed outside of mold compound 250, as shown in FIG. 1. Such exposure of heat transfer conduit 231 outside mold compound 250 allows heat transfer conduit 231 to be cooled using a fan or other heat exchange mechanism (not shown), thus providing for the efficient and effective removal of heat from stacked die package 100. In a different embodiment, the heat transfer conduit may be entirely enclosed within the mold compound. A fully-enclosed heat transfer conduit may be used for thermal heat spreading inside the mold compound, which can be very important for overall device performance and reliability, but is not well suited for removing heat to a location outside the mold compound.

Coolant connections (not shown) can be made within the mold compound, if the heat transfer conduit is contained with the mold compound, or can be made externally to the mold compound if the heat transfer conduit extends outside of the mold compound. Furthermore, cooling structures for the purpose of fluid cooling can also be present. Because such cooling structures are known in the art they are not explicitly illustrated herein but can include wicking structures such as those found in heat pipes, active structures such as pumps to move fluid between hot and cold regions, and the like.

Referring still to FIGS. 1 and 2, spacer 230 further comprises a center portion 232 and a perimeter 233, and heat transfer conduit 231 comprises a channel 234 attached to spacer 230 at perimeter 233. In the illustrated embodiment, channel 234 is an interior portion of heat transfer conduit 231 and, in that embodiment, is therefore enclosed except at its endpoints. In other embodiments, channel 234 may be open rather than enclosed, and be, for example, a ditch, a trench, or the like. Such an open channel may be used to advantage, for example, in the case where mold compound 250 is hermetically sealed.

In one embodiment, heat transfer conduit 231 contains a cooling fluid (not shown). As an example, the cooling fluid may be contained within channel 234. As another example, the cooling fluid can comprise a fluid such as potassium formate, water, a mixture of water and antifreeze, a perfluorinate coolant, or the like. As a particular example, the cooling fluid may comprise a non-electrically conductive liquid perfluorinate coolant such as those made by 3M, including 3M's HFE-7100 coolant and similar coolants. The cooling fluid contained within heat transfer conduit 231 in these embodiments may, as an example, be circulated by active pumping action, such as with a mechanical pump, or by passive pumping action, such as with a wicking action.

Figure 3:
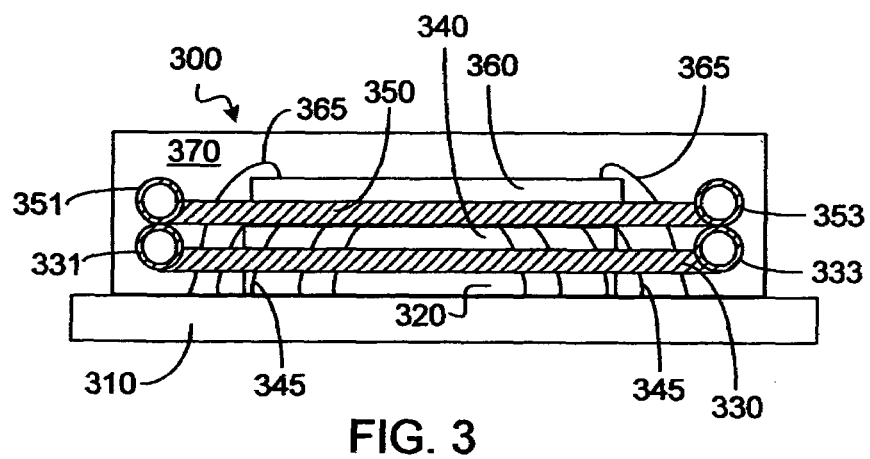
FIG. 3 is a cross sectional view of a different stacked die package according to an embodiment of the invention.
Figure 4:
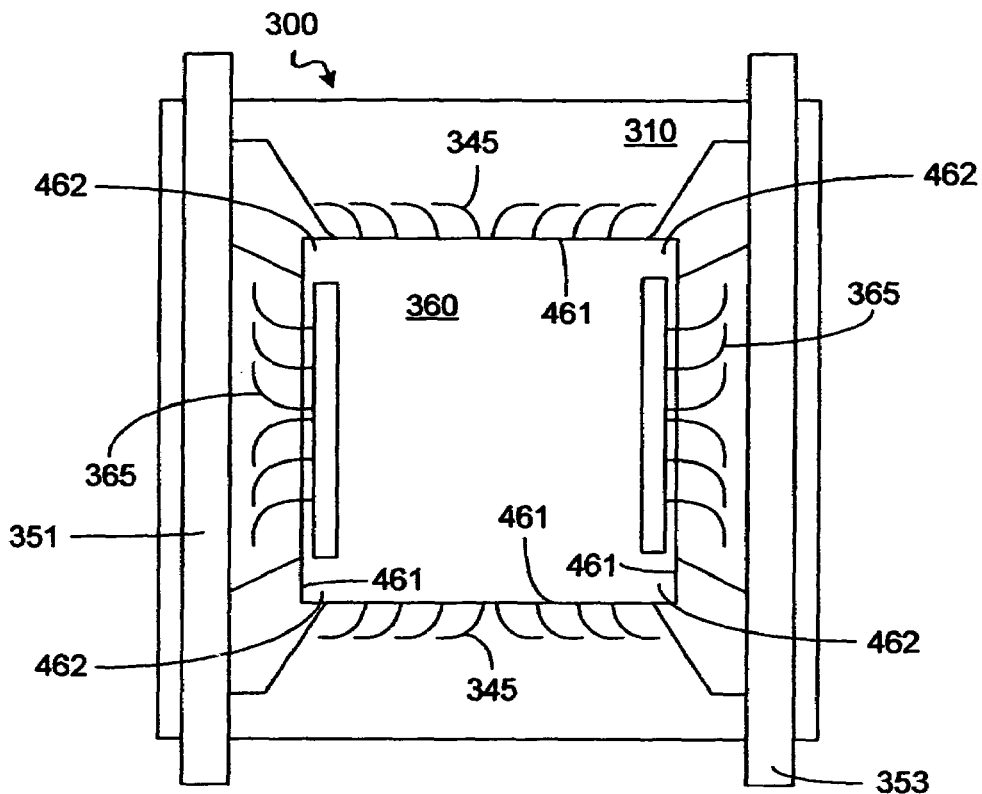
FIGS. 4 and 5 are top views of the stacked die package of FIG. 3.
Figure 5:
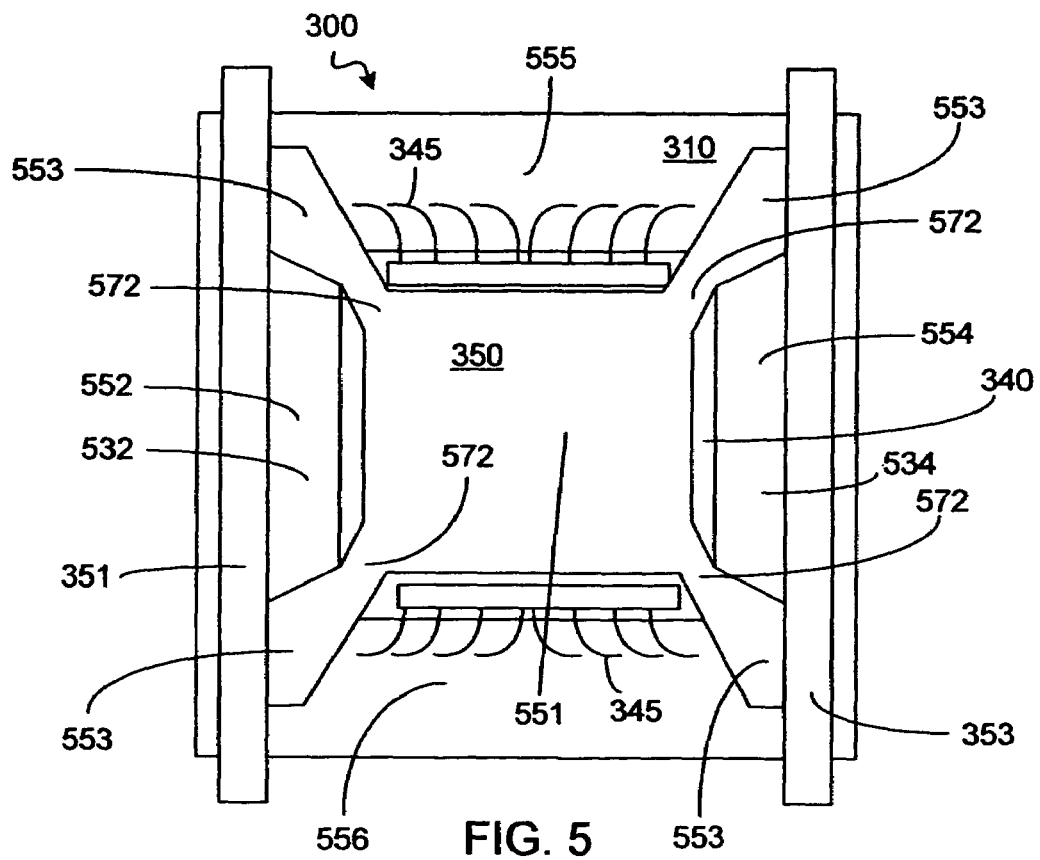

FIG. 3 is a cross sectional view and FIGS. 4 and 5 are top views of a stacked die package 300 according to an embodiment of the invention. As illustrated in FIGS. 3-5, stacked die package 300 comprises a substrate 310, a flip chip die 320 above substrate 310, a spacer 330 above flip chip die 320, a wire bond die 340 above spacer 330, a spacer 350 above wire bond die 340, a wire bond die 360 above spacer 350, and a mold compound 370 disposed around at least a portion of flip chip die 320, spacers 330 and 350, and wire bond dies 340 and 360. (In FIGS. 4 and 5 mold compound 370 has been removed so as to more clearly show the other components of stacked die package 300.) As an example, substrate 310, flip chip die 320, spacers 330 and 350, wire bond dies 340 and 360, and mold compound 370 can be similar to, respectively, substrate 210, die 220, spacer 230, die 240, and mold compound 250, all of which were shown in FIG. 2.

Wire bond die 340 is connected to substrate 310 by a plurality of wire bonds 345. Similarly, wire bond die 360 is connected to substrate 310 by a plurality of wire bonds 365. As is typical, wire bond die 360 has a substantially rectangular shape having (substantially straight) sides 461, adjacent pairs of which meet at corners 462. As is also typical, plurality of wire bonds 365 are attached to wire bond die 360 at one pair of opposing sides 461 and extend from those opposing sides to substrate 310. Wire bond die 340 has a similar shape and construction, and plurality of wire bonds 345 extend from a pair of opposing sides of wire bond die 340 to substrate 310. In the embodiment of FIG. 4, the pair of opposing sides 461 of wire bond die 360 to which plurality of wire bonds 365 are attached is offset 90 degrees from the pair of opposing sides at which plurality of wire bonds 345 are attached to wire bond die 340.

A result of the geometry set forth in the foregoing paragraph and shown in FIGS. 3-5 is that all sides of dies 340 and 360 are occupied by wire bonds. Spacers 330 and 350, therefore, cannot take the form of a planar sheet as does spacer 230 in FIGS. 1 and 2 because such form would get in the way of at least some of the wire bonds in one or both of pluralities of wire bonds 345 and 365. Accordingly, in one embodiment of the invention spacers 330 and 350 are shaped so as to accommodate pluralities of wire bonds 345 and 365 as illustrated in FIG. 5 and further described below.

Spacer 350 comprises a heat transfer conduit 351 and a cutout 552 capable of admitting the passage of at least a portion of plurality of wire bonds 365. In one embodiment, heat transfer conduit 351 is made up of a portion of spacer 350 that is formed into a roll.

Note that FIG. 5 depicts stacked die package 300 with wire bond die 360, plurality of wire bonds 365, and, as explained earlier, certain portions of mold compound 370 removed in order to show certain interior details of stacked die package 300. Cutout 552 is a region of spacer 350, or a region adjacent to spacer 350, in which material has been removed or was never formed. As an example, cutout 552 may be formed by punching out an appropriate area or region of spacer 350. As another example, cutout 552 may be formed as a void or empty region during the formation of spacer 350. It should be understood that the word "cutout" as used in this context herein does not require or imply any particular method of formation or creation, but instead merely refers to the opening, gap, channel, passageway, empty space, void, or other area through which one or more wire bonds are capable of being passed or in which such wire bonds are capable of being located.

Spacer 330 comprises a heat transfer conduit 331 and a cutout 532 capable of admitting the passage of at least a portion of plurality of wire bonds 345. In FIG. 5, heat transfer conduit 331 and cutout 532 are directly underneath corresponding portions of spacer 350. As a result, heat transfer conduit 331 is not visible in FIG. 5, and cutout 532, though visible (and having its own reference numeral) in FIG. 5, is indistinguishable in that view from cutout 552.

In one embodiment, spacer 330 further comprises a heat transfer conduit 333 in addition to heat transfer conduit 331, and also further comprises a cutout 534 in addition to cutout 532. In the same or another embodiment, and as illustrated in FIGS. 4 and 5, spacer 350 comprises a heat transfer conduit 353 in addition to heat transfer conduit 351, and also further comprises a cutout 554 in addition to cutout 552. In FIG. 5, heat transfer conduit 333 and cutout 534 are directly underneath corresponding portions of spacer 350. As a result, heat transfer conduit 333 is not visible in FIG. 5, and cutout 534, though visible (and having its own reference numeral) in FIG. 5, is indistinguishable in that view from cutout 554.

In the illustrated embodiment, spacer 350 still further comprises cutouts 555 and 556, but it should be understood that either or both of spacers 330 and 350 can have one, two, three, four, or some other number of cutouts, and one, two, or some other number of heat transfer conduits.

Referring again to the illustration of FIG. 5, spacer 350 comprises a center portion 551 having a plurality of corners 572, and a plurality of lobes 553, each one of which is attached to and extends from one of plurality of corners 572. Furthermore, although such is not illustrated in FIG. 5 because of the limitations imposed by the viewing angle, spacer 330, at least in one embodiment, also comprises a center portion and also has a plurality of corners and a plurality of lobes attached to and extending from the corners. Also possible are other embodiments in which the geometry of spacer 330 is different from the geometry of spacer 350. As an example, a spacer having only two lobes (or some other number of lobes) instead of four lobes is possible, as is a spacer having lobes or other extensions that are attached to and extend away from the center portion of the spacer at a location other than at the corners of the spacer.

As will be readily apparent to one of ordinary skill in the art, spacers 330 and 350 and cutouts 532 and 552 need not necessarily have the x-like shape depicted by FIGS. 4 and 5, but could alternatively have any other shape that provides at least: (1) a thermal conduction path between the body of the spacer and the heat transfer conduits; and (2) a place for the passage of one or more wire bonds as it or they traverse a distance between a wire bond die and substrate 310. Similarly, lobes 553 need not necessarily have the shape or form that they take in FIG. 5, but need only make a thermal connection capable of assisting with heat dissipation from stacked die package 300.

Figure 6:
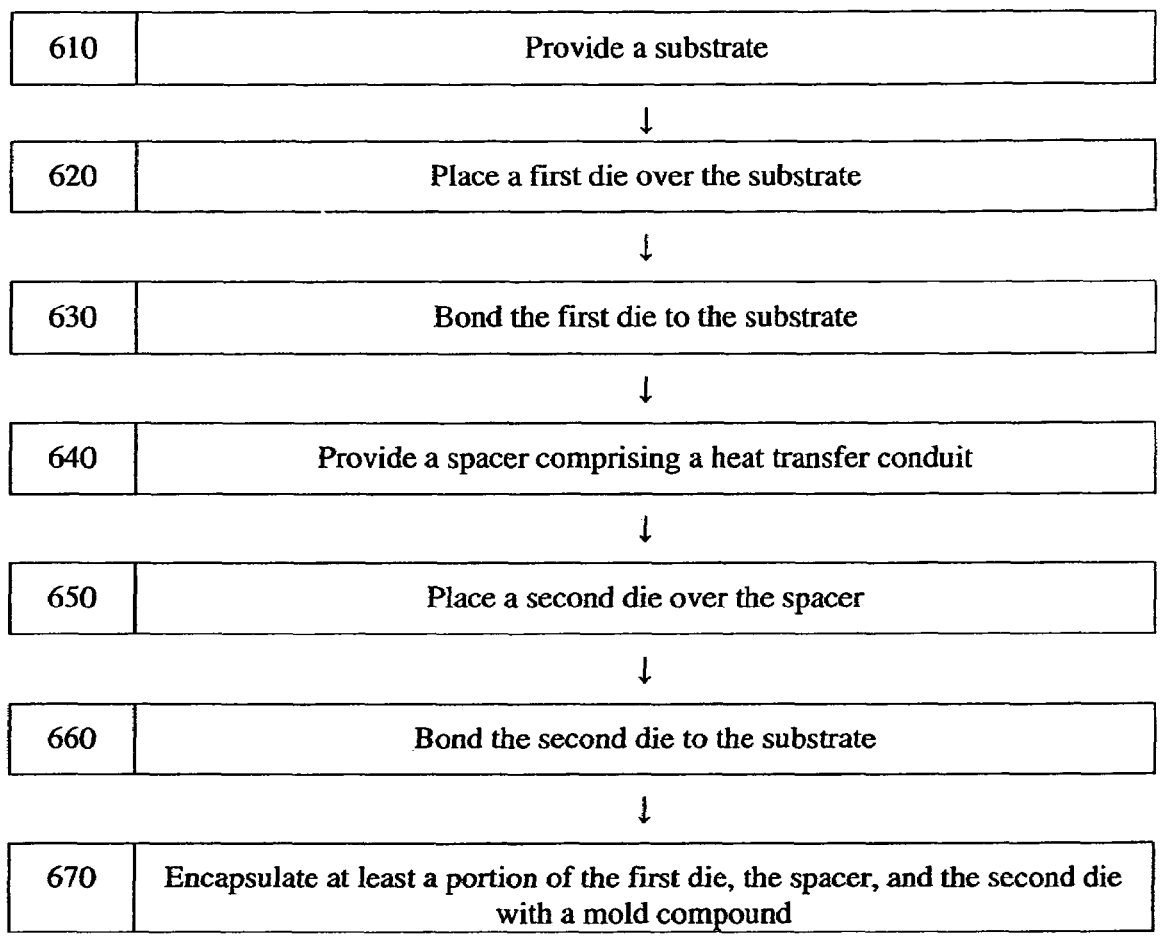
FIG. 6 is a flowchart illustrating a method of manufacturing a stacked die package according to an embodiment of the invention.

FIG. 6 is a flowchart illustrating a method 600 of manufacturing a stacked die package according to an embodiment of the invention. A step 610 of method 600 is to provide a substrate. As an example, the substrate can be similar to substrate 210, first described in connection with FIG. 2.

A step 620 of method 600 is to place a first die over the substrate. As an example, the first die can be similar to die 220, first described in connection with FIG. 2.

A step 630 of method 600 is to bond the first die to the substrate. As an example, the bonding of the first die to the substrate can be accomplished via a flip chip bonding process.

A step 640 of method 600 is to provide a spacer comprising a heat transfer conduit. As an example, the spacer and the heat transfer conduit can be similar to, respectively, spacer 230 and heat transfer conduit 231, both of which were first described in connection with FIG. 2. In one embodiment, step 640 comprises providing a substantially planar sheet of thermally conductive material, and further comprises punching out a portion of the substantially planar sheet to create a cutout in the substantially planar sheet using a punch tool, a stamp, or the like. In a particular embodiment providing the substantially planar sheet comprises providing the substantially planar sheet to have a center portion and a perimeter surrounding the center portion, and step 640 further comprises rolling at least a portion of the perimeter into a heat pipe or a similar roll or the like. In a different embodiment, step 640 or another step comprises soldering or brazing (or attaching using another method, such as bonding with a thermally conductive epoxy or the like) a heat pipe or the like to the spacer.

A step 650 of method 600 is to place a second die over the spacer. As an example, the second die can be similar to die 240, first described in connection with FIG. 2.

A step 660 of method 600 is to bond the second die to the substrate. As an example, the bonding of the second die to the substrate can be accomplished via a wire bonding process. If more than one wire bond die is desired in the stacked die package, steps 640, 650, and 660 may be repeated following the initial performance of step 660 in order to add such additional wire bond dies.

A step 670 of method 600 is to encapsulate at least a portion of the first die, the spacer, and the second die with a mold compound. As an example, the mold compound can be similar to mold compound 250, first described in connection with FIG. 2.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the stacked die package and the method discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A stacked die package comprising:
a substrate;
a first die above the substrate;
a spacer above the first die;
a second die above the spacer; and
a mold compound disposed around at least a portion of the first die, the spacer, and the second die,
wherein:
the spacer comprises a heat transfer conduit and further comprises a center portion and a perimeter; and
the heat transfer conduit comprises a channel attached at the perimeter of the spacer.

2. The stacked die package of claim 1 wherein:
the heat transfer conduit is entirely enclosed within the mold compound.

3. The stacked die package of claim 2 further comprising:
a coolant connection within the mold compound and attached to the heat transfer conduit.

4. The stacked die package of claim 1 wherein:
a portion of the heat transfer conduit is outside the mold compound.

5. The stacked die package of claim 4 further comprising:
a coolant connection outside of the mold compound and attached to the heat transfer conduit.

6. The stacked die package of claim 1 wherein:
the first die has a first edge and the second die has a second edge; and
the heat transfer conduit extends beyond the first edge and the second edge.

7. The stacked die package of claim 1 wherein:
a portion of the spacer forms a roll at the perimeter of the spacer; and
the roll is the heat transfer conduit.

8. The stacked die package of claim 1 wherein:
the spacer comprises a material selected from the group consisting of copper, aluminum, silver, silicon, and silicon carbide.

9. The stacked die package of claim 1 wherein:
the heat transfer conduit comprises a hollow tube.

10. The stacked die package of claim 9 wherein:
the heat transfer conduit contains a cooling fluid.

11. The stacked die package of claim 10 wherein:
the cooling fluid comprises a fluid selected from the group consisting of: water, a mixture of water and an anti-freezing agent, potassium formate; and a perfluorinate coolant.

12. The stacked die package of claim 9 wherein:
the heat transfer conduit is soldered to the spacer.

13. The stacked die package of claim 9 wherein:
the heat transfer conduit is attached to the spacer using one of:
a brazing process; and
a bonding process using a thermally conductive substance.

14. A stacked die package comprising:
a substrate;
a flip chip die above the substrate;
a first spacer above the flip chip die;
a first wire bond die above the first spacer and connected to the substrate by a first plurality of wire bonds;
a second spacer above the first wire bond die;
a second wire bond die above the second spacer and connected to the substrate by a second plurality of wire bonds; and
a mold compound disposed around at least a portion of the first flip chip die, the first spacer, the first wire bond die, the second spacer, and the second wire bond die,
wherein:
the first spacer comprises a first heat transfer conduit and a first cutout capable of admitting at least a portion of the first plurality of wire bonds; and
the second spacer comprises a second heat transfer conduit and a second cutout capable of admitting at least a portion of the second plurality of wire bonds.

15. The stacked die package of claim 14 wherein:
the first spacer comprises a third heat transfer conduit in addition to the first heat transfer conduit and a third cutout in addition to the first cutout; and
the second spacer comprises a fourth heat transfer conduit in addition to the second heat transfer conduit and a fourth cutout in addition to the second cutout.

16. The stacked die package of claim 15 wherein:
the first spacer comprises:
a center portion having a plurality of corners; and
a plurality of lobes, each one of which is attached to one of the plurality of corners.

17. The stacked die package of claim 14 wherein:
the first heat transfer conduit is made up of a portion of the first spacer that is formed into a roll.

18. The stacked die package of claim 17 wherein:
the first spacer comprises a material selected from the group consisting of: copper; aluminum; silver; silicon; and silicon carbide; and
the second spacer also comprises a material selected from the group consisting of: copper, aluminum; silver; silicon; and silicon carbide.

19. The stacked die package of claim 18 wherein:
the first heat transfer conduit comprises a hollow tube having a substantially circular cross section.

20. The stacked die package of claim 19 wherein:
the first heat transfer conduit contains a cooling fluid; and
the cooling fluid comprises a fluid selected from the group consisting of: water, a mixture of water and an anti-freezing agent, potassium formate; and a perfluonnate coolant.

21. The stacked die package of claim 20 wherein:
the first heat transfer conduit is soldered to the first spacer.

22. The stacked die package of claim 14 further comprising:
a cooling structure coupled to the first heat transfer conduit.

23. A method of manufacturing a stacked die package, the method comprising:
providing a substrate;
placing a first die over the substrate;
bonding the first die to the substrate;
providing a spacer comprising a heat transfer conduit, a center portion, and a perimeter, where the heat transfer conduit comprises a channel attached at the perimeter of the spacer;
placing the spacer over the first die;
placing a second die over the spacer;

bonding the second die to the substrate;

encapsulating at least a portion of the first die, the spacer, and the second die with a mold compound.

24. The method of claim 23 wherein:

providing the spacer comprises:

providing a substantially planar sheet of thermally conductive material; and punching out a portion of the substantially planar sheet to create a cutout in the substantially planar sheet.

25. The method of claim 24 wherein:

providing the substantially planar sheet comprises providing the substantially planar sheet having a center portion and a perimeter surrounding the center portion; and providing the spacer further comprises rolling at least a portion of the perimeter into a heat pipe.

26. The method of claim 24 wherein:

forming the spacer further comprises soldering a heat pipe to the spacer.

* * * * *